United States Patent [19]

Yamaga et al.

[11] Patent Number: 5,578,132
[45] Date of Patent: Nov. 26, 1996

[54] APPARATUS FOR HEAT TREATING SEMICONDUCTORS AT NORMAL PRESSURE AND LOW PRESSURE

[75] Inventors: Kenichi Yamaga, Sagamihara; Toshiki Kobayashi, Zama, both of Japan

[73] Assignees: Tokyo Electron Kabushiki Kaisha, Tokyo; Tokyo Electron Tohoku Kabushiki Kaisha, Iwate-Ken, both of Japan

[21] Appl. No.: 269,608

[22] Filed: Jul. 5, 1994

[30] Foreign Application Priority Data

| Jul. 7, 1993 | [JP] | Japan | 5-192771 |
| Aug. 19, 1993 | [JP] | Japan | 5-225071 |
| Aug. 30, 1993 | [JP] | Japan | 5-235854 |

[51] Int. Cl.⁶ ............................................. C23C 16/00
[52] U.S. Cl. ..................... 118/724; 118/715; 432/241; 219/390; 219/406
[58] Field of Search ....................... 118/715, 724, 118/50; 117/100, 224; 373/109, 110, 111, 112; 219/390, 391, 405, 406, 411; 392/416, 418; 432/241

[56] References Cited

U.S. PATENT DOCUMENTS

| 4,989,540 | 2/1991 | Fuse | 118/719 |
| 5,016,567 | 5/1991 | Iwabuchi et al. | 118/733 |
| 5,029,554 | 7/1991 | Miyashita | 118/715 |
| 5,076,206 | 12/1991 | Bailey | 118/724 |
| 5,127,365 | 7/1992 | Koyama | 118/724 |
| 5,133,561 | 7/1992 | Hattori | 277/3 |
| 5,167,716 | 12/1992 | Boitnott | 118/719 |
| 5,207,573 | 5/1993 | Miyagi | 432/152 |
| 5,252,133 | 10/1993 | Miyazaki | 118/725 |
| 5,279,670 | 1/1994 | Watanabe | 118/725 |
| 5,324,540 | 6/1994 | Terada | 427/255.5 |
| 5,368,648 | 11/1994 | Sekizuka | 118/733 |
| 5,370,371 | 12/1994 | Miyagi | 266/256 |
| 5,433,784 | 7/1995 | Miyagi | 118/715 |
| 5,458,685 | 10/1995 | Hasebe | 118/724 |
| 5,478,397 | 12/1995 | Shibata | 118/724 |
| 5,482,558 | 1/1996 | Watanabe | 118/728 |
| 5,482,559 | 1/1996 | Imai | 118/728 |
| 5,484,484 | 1/1996 | Yamaga | 118/719 |

FOREIGN PATENT DOCUMENTS

| 2-52420 | 2/1990 | Japan . | |
| 0061068 | 3/1990 | Japan | 118/724 |
| 0249936 | 11/1991 | Japan | 118/733 |
| 0017326 | 1/1992 | Japan | 118/724 |
| 0044313 | 2/1992 | Japan | 118/724 |
| 0134815 | 5/1992 | Japan | 118/724 |
| 0206631 | 7/1992 | Japan | 118/724 |
| 0264716 | 9/1992 | Japan | 118/724 |
| 0269822 | 9/1992 | Japan | 118/733 |
| 0036609 | 2/1993 | Japan | 118/724 |
| 0151312 | 5/1994 | Japan | 118/733 |

*Primary Examiner*—R. Bruce Breneman
*Assistant Examiner*—Jeffrie R. Lund
*Attorney, Agent, or Firm*—Beveridge, DeGrandi, Weilacher & Young

[57] ABSTRACT

A heat treating unit for semiconductor processing is adapted to conduct normal pressure high temperature processing and low pressure thermal processing using corrosive gases. The unit includes an inner tube for receiving a boat which carries objects to be processed, an outer tube concentrically disposed outside the inner tube, a cylindrical manifold which has a gas feed port and an exhaust port, and a cap which tightly closes an opening of the manifold. The inner tube, outer tube and manifold are formed of quartz which is heat resistant and corrosion resistant, and these three components are integrally joined together by melting. The interior surface of the cap is provided with a protecting layer which is heat resistant and corrosion resistant. A connection between the cap and the manifold includes a high temperature heat resistant seal in which O-rings are cooled by a cooling system.

5 Claims, 12 Drawing Sheets

APPARATUS FOR HEAT TREATING SEMICONDUCTORS AT NORMAL PRESSURE AND LOW PRESSURE

BACKGROUND OF THE INVENTION

The present invention relates to a heat treatment apparatus which can conduct both normal pressure high temperature processing and low pressure processing.

In the fabrication of semiconductor products, objects to be treated, such as semiconductor devices, are subjected to a required heat treatment in a uniform thermal state. On the surfaces of the objects to be treated thin films are formed, heat diffusion is conducted, etc. The heat treatment apparatus is used for these purposes.

Heat treatment apparatus is known for normal pressure high temperature processing for heat treatment at, e.g., a substantially atmospheric pressure and a high temperature of, e.g., about 1000° C., and a low-pressure heat treatment apparatus for heat treatment at a low pressure of, e.g., some Torr pressure at about 800° C. A heat treatment apparatus is selected on the basis of the kind of heat treatment to be conducted on particular types of semiconductor wafers. A normal pressure high temperature heat treatment apparatus is sometimes followed by a low-pressure heat treatment apparatus, which requires moving the wafers. The reverse processing thereof is also conducted.

Such processing will be explained by means of, e.g., a low-pressure heat treatment apparatus. FIG. 13 shows a vertical sectional view of the conventional low-pressure heat treatment apparatus. A heating furnace 2 comprises a processing vessel 8 including an inner tube 4 of quartz having the lower end opened, and an outer tube 6 of quartz disposed concentrically with the inner tube. A heater 10 is wound around the outside of the outer tube 6.

A wafer boat 12 of, e.g., quartz is accommodated in the processing vessel 8, and is loaded and unloaded through the bottom into and out of the processing vessel 8. A number of objects to be processed, e.g., semiconductor wafers W are held on the boat 12 longitudinally at a set pitch.

A manifold 14 of stainless steel is connected to the bottom of the processing vessel 8. To be specific, a bottom flange 6A of the outer tube 6 is air-tightly connected through an O-ring 16 to a top flange 14A of the manifold 14, and the lower end of the inner tube 4 is removably set on an annular step 14B provided on the middle part of the manifold 14. A gas feed port 18 for introducing a processing gas into the processing vessel 8, and a gas exhaust port 20 for exhausting a gas in the processing vessel out of the apparatus are provided in the manifold 14.

In the bottom opening of the manifold 14 there is air-tightly provided, through an O-ring 28, a stainless steel cap 26 mounted on an arm 24 of lift means, such as an elevator or others. The wafer boat 12 is mounted on the cap 26 through a quartz heat insulating cylinder 30.

A rotary shaft journalled by a bearing 31 is inserted through the cap 26, and the heat insulating cylinder 30 is rotatably supported on the upper end of the rotary shaft.

Near the O-rings 16, 28, there are provided cooling means which prevent the O-rings 16, 28 from melting due to a high temperature of 800° C. of the processing vessel.

When a heat treatment is conducted in such low-pressure heat treatment apparatus, a processing gas is fed through the gas feed port 18 into the interior of the processing vessel 8 maintained at a processing temperature of about 800° C. and in a vacuum state of, e.g., 1 Torr. The introduced processing gas ascends in contact with a wafer region, processing the wafers W, and descends between the inner tube 4 and the outer tube 6 to be discharged outside the processing vessel 8 through the gas exhaust port 20.

In such conventional low-pressure heat treatment apparatus, a required heat treatment, e.g., thin film deposition, is followed by heat diffusion. Processed wafers are transferred into a different normal pressure high temperature heat treatment vessel to conduct the required heat treatment on the wafers.

It takes time to transfer the wafers, and throughputs are lowered. When the wafers are unloaded from the heating furnace for transfer, they are exposed to an atmosphere in a clean room. Particles can stay on the wafers and contaminate the wafers. These are problems with the conventional low-pressure heat treatment apparatus.

Furthermore, present practices essentially require two heat treatment apparatuses to conduct necessary heat treatments on wafers. This has added to equipment costs.

To solve these problems, it can be proposed to use one apparatus both as a low pressure heat treatment apparatus and a normal pressure high temperature heat treatment apparatus.

But when normal pressure high temperature processing is conducted in a low pressure heat treatment apparatus, the processing temperature is raised from about 800° C. for a low pressure to about 1000° C. at the normal pressure. Large amounts of corrosive gases, such as HCl, etc. corrode the stainless steel of the manifold 14.

When low pressure processing is conducted in a normal pressure high temperature heat treatment apparatus, the latter apparatus, which is intended for processing at a normal pressure, at around atmospheric pressure, uses an exhaust seal as a seal structure. It is a problem that the seal is easily broken at a low pressure vacuum state of about 1 Torr.

Heat treatment apparatus using, as processing gases, e.g., oxygen ($O_2$) and corrosive hydrogen chloride (HCl), is substantially free from one problem with regard to the metal members at the lower interior part of the inner tube. Dry hydrogen chloride is relatively inert, and the processing gases flow in the reaction tube (specifically the inner tube) of the processing vessel from below to above. Thus, the apparatus disclosed in, e.g., Japanese Patent Laid-Open Publication (KOKAI) No. 138730/1990 does not much require corrosion preventive means for the metal members at the lower interior of the inner tube, as does heat treatment apparatus in which processing gases flow horizontally through the reaction tube.

But it is often the case with this heat treatment apparatus that exhaust gas after processing, e.g., hydrogen chloride takes in moisture and becomes very corrosive. In this case, the corrosive exhaust gas (containing corrosive products) descends between the inner and the outer tubes of the reaction tube to be discharged. The manifold becomes corroded when the processing gases pass between the lower ends of the inner and the outer tubes of the reaction tube. This is a problem with this heat treatment apparatus.

As means for solving this corrosion problem, it can be proposed that the reaction tube have the lower end portions of the inner tube and the outer tubes in one-piece. But a problem with this structure is that such a reaction tube is difficult to manufacture, clean and handle.

In the fabrication of semiconductor wafers, various heat treatment apparatuses for CVD, oxidation, diffusion, annealing, etc. are used. For example, a heat treatment apparatus (hereinafter also called vacuum heat treatment apparatus) for conducting processing in vacuum, such as low pressure CVD or others includes a processing gas feeding unit and an evacuation unit connected to the processing chamber for accommodating objects to be processed. A heat treatment apparatus (hereinafter also called ordinary pressure processing apparatus) for conducting processing at the ordinary pressure (atmospheric pressure) includes an ordinary pressure exhaust unit in place of the evacuation unit of the vacuum heat treatment apparatus connected to the processing chamber. The ordinary pressure heat treatment apparatus uses, in some cases, corrosive processing gases, e.g., hydrogen chloride (HCl).

The vacuum heat treatment apparatus and the ordinary pressure heat treatment apparatus simply differ from each other roughly in the exhaust unit. The exhaust unit includes both the evacuation unit and the ordinary exhaust unit, whereby a combined heat treatment apparatus can be provided. This combined heat treatment apparatus can achieve lower equipment costs, and it does not require semiconductor wafers to be transferred to a different heat treatment apparatus for each heat treatment, whereby various heat treatments can be continuously conducted. Accordingly higher quality and throughputs of semiconductor wafers can be achieved.

But the combined heat treatment apparatus has to include in the ordinary exhaust unit a corrosion resistant valve, e.g., a ball valve or others of, e.g., Teflon (registered trademark). Generally such valve is inferior in air-tightness. When the evacuation unit is operated for processing, exhaust gas particles flow reversely from the ordinary pressure exhaust unit, and if the exhaust gas, etc. have residual corrosive components, they may corrode machines and tools of the evacuation unit. Thus it has been difficult to realize a heat treatment apparatus which can conduct processing both in vacuum and at ordinary pressure.

SUMMARY OF THE INVENTION

In view of the above-described problems the present invention was made to effectively solve the problems. An object of the present invention is to provide a combined heat treatment apparatus which can singly conduct both ordinary pressure high temperature processing and low pressure processing.

Then an object of the present invention is to provide a heat treatment apparatus which can preclude corrosion of the manifold by contact of corrosive exhaust gas passing between the separated lower ends of the inner and the outer tubes, whereby the manifold can last longer.

To achieve the above-described object, the heat treatment apparatus according to the present invention comprises an inner tube and an outer tube which are heat resistant, corrosion resistant, and disposed concentrically with each other on a metal manifold, a processing gas being fed to objects to be processed accommodated in the inner tube from below in a heated atmosphere, and exhaust gas after a processing being discharged between the inner and the outer tubes, and a set gap for injecting a seal gas being provided between bottom ends of the inner and the outer tubes in contact with the manifold.

According to the present invention, a seal gas seals between the separated lower ends of the inner and the outer tubes in contact with the manifold. The manifold can be prevented from corrosion by contact with corrosive exhaust gas, and the manifold can last longer.

An object of the present invention is to provide a heat treatment apparatus and a method for operating the heat treatment apparatus which can prevent reverse flow of exhaust gas etc. from the normal pressure exhaust unit in a processing in vacuum, and which can conduct both vacuum processing and normal pressure processing.

To achieve the above-described object, the heat treatment apparatus comprising a processing chamber including an inner tube having the bottom opened for accommodating objects to be processed on an object-to-be processed boat, and an outer tube concentrically disposed outside the inner tube; a gas feed port connected to the processing chamber for introducing a processing gas into the processing chamber, a cylindrical manifold having a exhaust gas port for discharging gas in the processing chamber; and a cap for tightly closing the opened bottom of the manifold openably, the inner and the outer tube, and the manifold being formed of a heat resistant corrosion resistant material and being formed integral with each other, a surface of the cap on the side of the processing chamber being coated with a protecting layer of a heat resistant corrosion resistant material, high temperature heat resistant seal being provided in a connection between the cap and the manifold.

According to the present invention of the above-described structure, the inner and the outer tubes, and the manifold are integrally formed of a heat resistant corrosion resistant material, e.g., quartz, and the protecting layer of a heat resistant corrosion resistant material formed on the inner side of the cap. Furthermore, high temperature heat resistant seal means is used in the seal portions. As a result, even when corrosive gas is flowed in a normal pressure high temperature processing, the material of the processing vessel, the manifold, etc. are free from corrosion due to the corrosive gas, and in addition, the seal means is not damaged by a high temperature of about 1000° C.

In low pressure heat treatment, the interior of the processing vessel is in a vacuum state of an about 1 Torr. But as described above, the seal means is not thermally damaged and can maintain its seal function. The low pressure thermal operation can be efficiently conducted.

To achieve the above-described object, the present invention comprises a processing gas feed unit and an exhaust unit connected to a processing chamber for processing objects to be processed, the exhaust unit including an evacuation unit a normal pressure exhaust unit, the normal exhaust unit having a pair of valves, evacuation means being inserted between the valves of the pair.

Furthermore, according to the heat treatment apparatus and a method for operating the same according to the present invention, in a processing with the evacuation unit operated, a pair of valves of the normal pressure exhaust unit closed, evacuation is conducted between the valves of the pair, whereby air-tightness of the normal pressure exhaust unit with the valves is improved. As a result, reverse flow of exhaust gas and particles from the normal exhaust unit in vacuum processing can be prevented. Thus the heat treatment apparatus which can conduct both vacuum processing and normal pressure processing can be provided.

DETAILED DESCRIPTION OF PREFERRED EMBODIMENTS

[First Embodiment]

The heat treatment apparatus according to a first embodiment of the present invention will be explained with reference to the drawings attached hereto.

Figure 1:
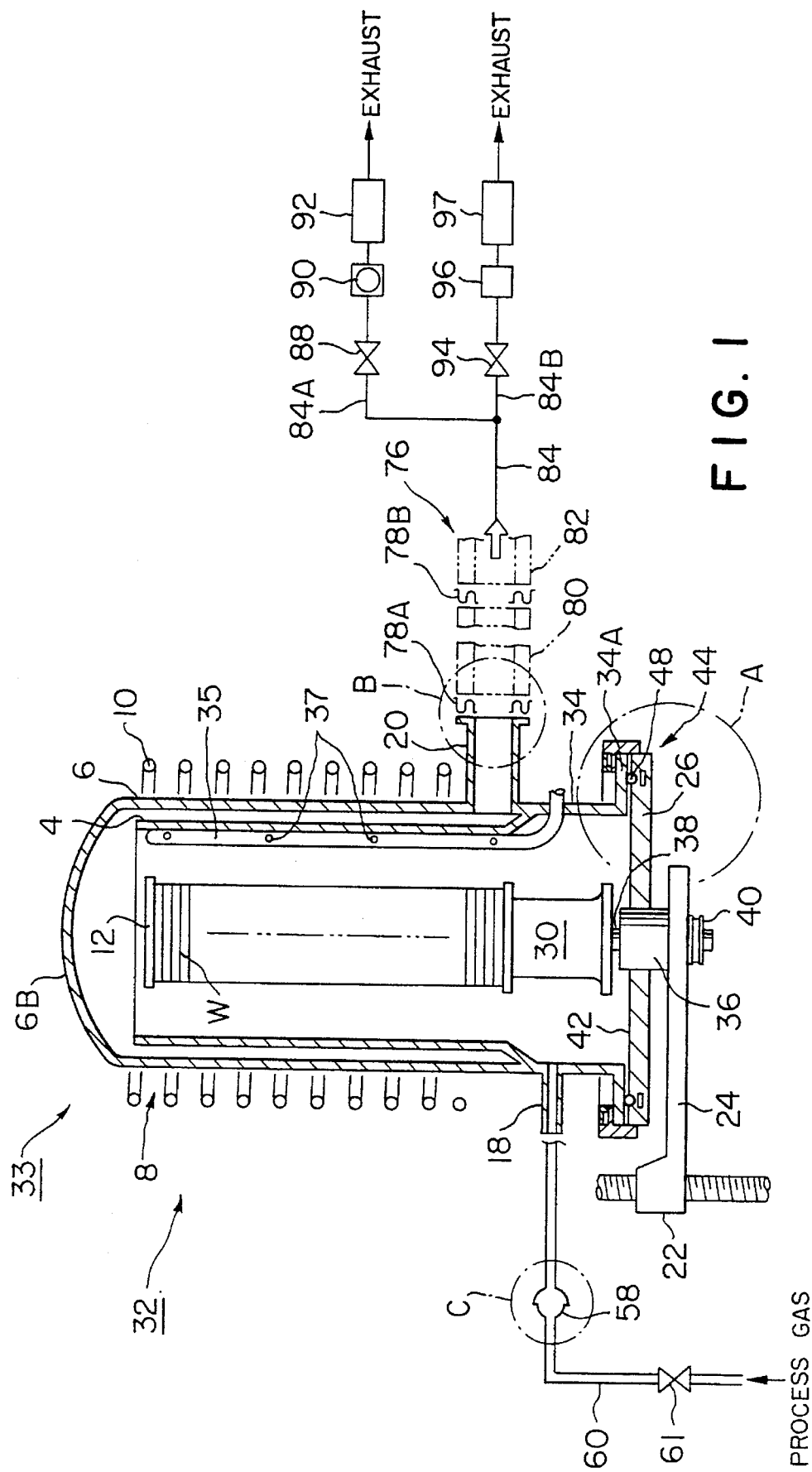
FIG. 1 is a block diagram of the heat treatment apparatus according to a first embodiment of the present invention.

As shown in FIG. 1, a heating furnace 33 of the heat treatment apparatus 32 according to a first embodiment of the present invention comprises a processing vessel (processing chamber) 8 including an inner pipe 4 of a heat resistant and corrosion resistant material, e.g., quartz having the lower end opened an erected, and an outer tube 6 of also quartz disposed around the outer circumference of the inner tube 4 concentrically therewith at a certain interval. A heater 10 of, e.g., resistance type is wound around the outer circumference of the processing vessel 8. The outer tube 6 has the ceiling 6B dome-shaped and the bottom connected integral with a cylindrical manifold 34 with a gas feed port 18 for introducing a processing gas into the processing vessel 8 and a gas exhaust port 20 for exhausting gas in the processing vessel 8. Specifically the manifold 34 is formed generally of the same material as the processing vessel 8, e.g., quartz, has the gas feed port 18 and the gas exhaust port 20 both of quartz projected therefrom, and has the bottom opened and the bottom circumference formed in a bottom flange 34A for connection. The gas exhaust port 20 has a large diameter of, e.g., about 3 inches for smaller exhaust resistance of evacuation for pressure reduction. These two ports 18, 20 are shown, but if necessary, a plurality of ports may be formed.

A diameter of the manifold 34 is the same as that of the outer tube 6, and the manifold 34 and the outer tube 6 are glass-melted into one piece in fabrication. Then the quartz cylindrical inner tube 4 is accommodated in the outer tube 6 and the manifold 34 in one-piece. A lower end portion of the inner tube 4 is divergently expanded to be glass-melted onto the inside of the manifold 34 as described above. Thus the inner 4, the outer tubes 6 and the manifold 34 are formed of and connected integrally by a heat resistant and corrosion resistant material, i.e., quartz.

A thermocouple tube 35 in the form of a thin tube accommodating thermocouples is provided longitudinally on an inside of the inner tube 4 integral therewith, and has the lower end extended outside the processing vessel through a side wall of the manifold 34. The thermocouple tube 35 accommodates a number of thermocouples 37 corresponding to a number of zones of the heater.

An objects-to-be-processed boat of, e.g., quartz, i.e., wafer boat 12 is accommodated in the processing vessel 8 removably at the bottom thereof. A number of objects to be processed, i.e., semiconductor wafers W are held on the boat 12 longitudinally at a set pitch.

In a bottom opening of the manifold 34 there is openably provided a stainless steel cap 26 mounted on an arm 24 of lift means, such as elevator or others. The wafer boat 12 is mounted on the cap 26 through a quartz heat insulating cylinder 30.

In this arrangement, to assure intra-plane homogeneity of deposited films on the wafers W, it is necessary to turn the wafer boat 12 during processing to expose the wafers W evenly to a processing gas. To this end, a rotary shaft 38 journalled by, e.g., magnetic seal bearing 36 is inserted through the cap 26. The rotary shaft 38 bears the heat insulating cylinder 30 on the top and rotates the same, and has a pulley 40 on a lower end portion, on which, although not shown, a transmission belt from a motor is wound. A protection layer 42 of a heat resistant corrosion resistant material, e.g., quartz is formed on the top surface of the stainless steel cap 26, i.e., on the side of the processing vessel so that the top surface can be resistant to a corrosive gas, e.g., hydrogen chloride (HCl).

On the connection between the lower flange 34A of the manifold 34 and the peripheral edge of the cap 26 there is provided high temperature resistant seal means 44 whose sealing ability is not deteriorated even at a 1000° C. furnace temperature, and this permits high temperature processing.

Figure 2:
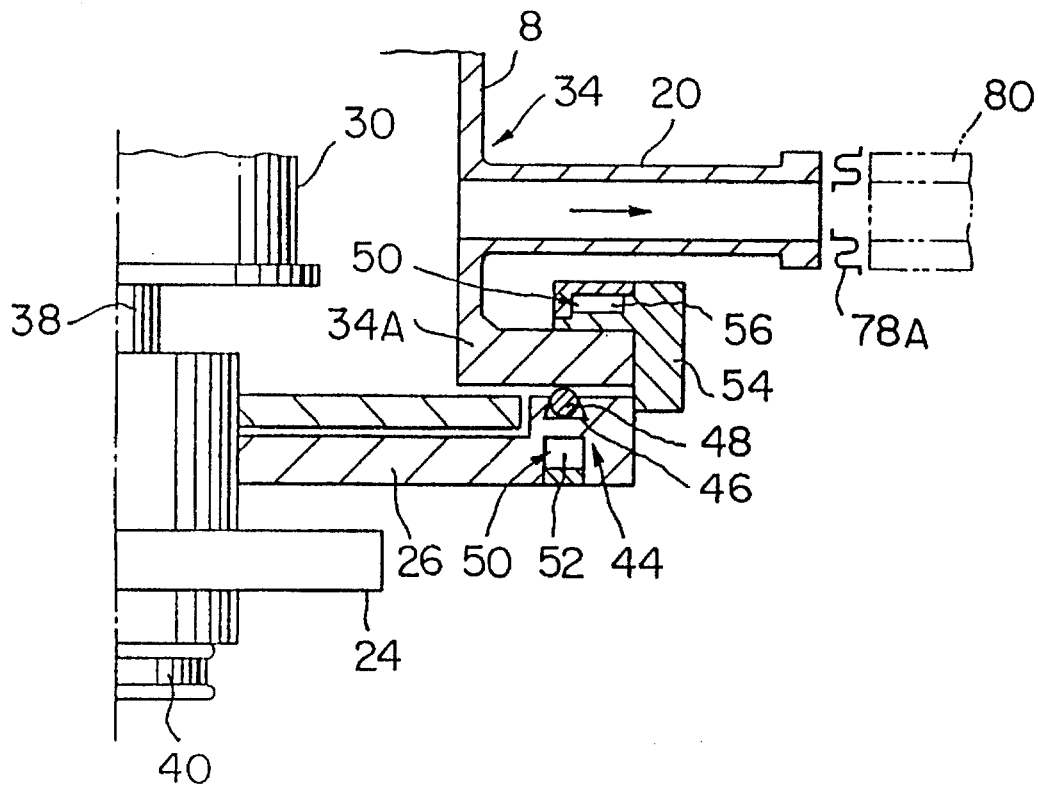
FIG. 2 is an enlarged vertical view of the portion (a seal structure of the cap) of the heat treatment apparatus of FIG. 1 indicated by the arrow A.

As also shown in FIG. 2, this high temperature resistant seal means 44 comprises a ring groove 46 formed in the peripheral edge of the cap 26, and an O-ring of fluoro rubber disposed in the groove 46. This O-ring 48 has good sealing ability but is inferior in heat resistance, and cooling mechanism 50 is provided for cooling the O-ring 48. The cooling mechanism 50 comprises a first cooling water passage 52 formed in a ring circumferentially in the cap 26, and a second cooling water passage 56 formed in a ring in a holding member 54 for holding the lower flange 34A of the manifold 34. During processing cooling water is passed through the cooling water passages 52, 56, so that the O-ring 48 is efficiently cooled.

Figure 4:
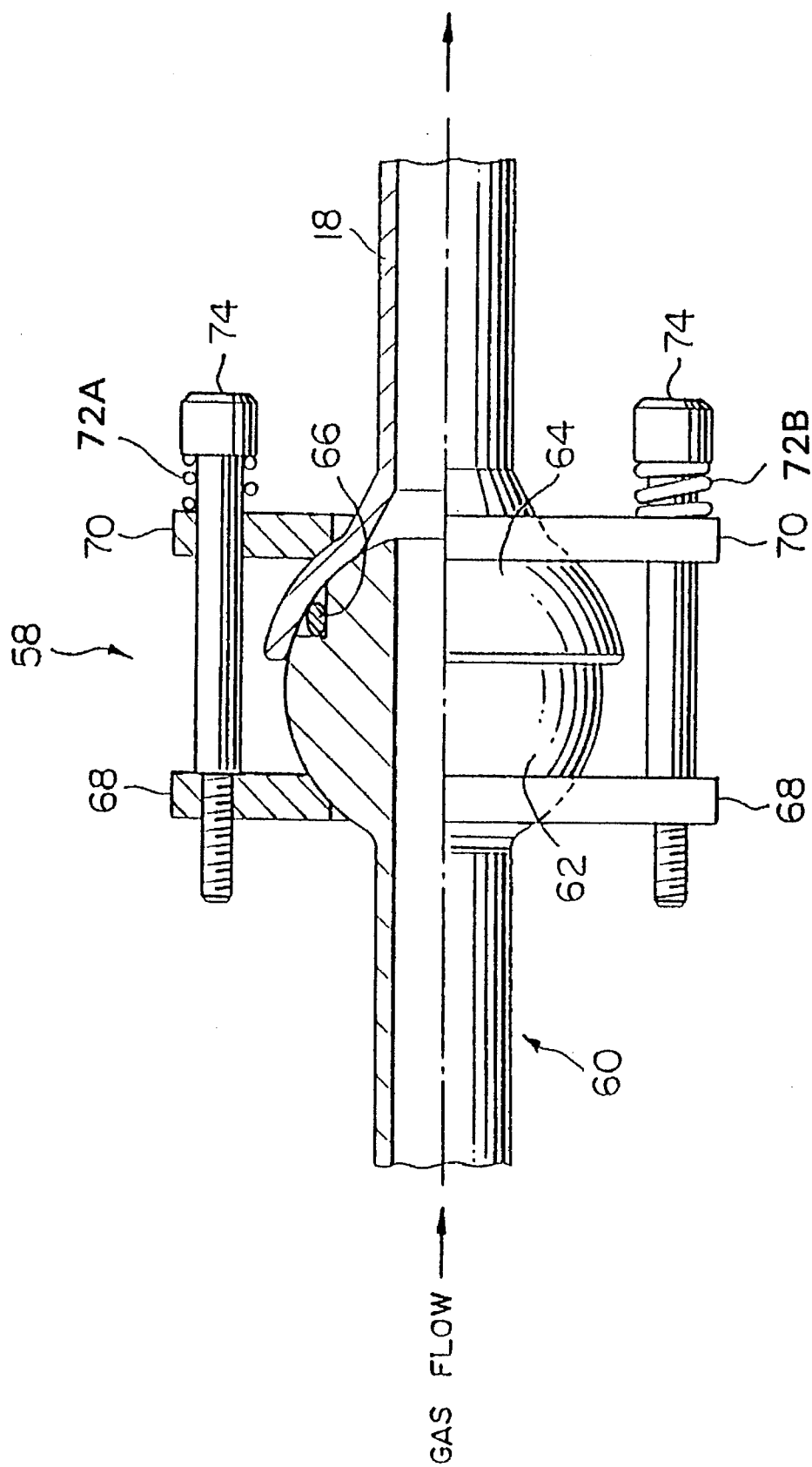
FIG. 4 is an enlarged vertical view of the portion (a seal structure of the gas feed port) of the heat treatment apparatus of FIG. 1 indicated by the arrow C.

As shown in FIG. 4, a gas feed unit 60 is connected to the gas feed port 18 through a ball joint 58 so that a processing gas, etc. can be fed. A gas feed valve 61 is inserted in the gas feed unit 60 (see FIG. 1) and is connected to processing gas sources not shown. The pipe of the gas feed unit 60 is a flexible tube of, e.g., Teflon. But the tube shrinks upon evacuation for pressure reduction, and against this the above-described ball joint 58 is necessary at the connection. The ball joint 58 comprises a ball-shaped joint body 62 having a passage inside, and a funnel-shaped receiver 64 for receiving the joint body 62. A O-ring 66 of, e.g., Teflon is provided between the joint body 62 and the receiver 64, so that heat resistance and sealing ability are much improved. Clamp plates 68, 70 are secured respectively to the joint body 62 and the receiver 64, and are fastened by a fastening bolt 74 with springs 72A, 72B disposed therebetween, so that the joint body 62 and the receiver 64 can be air-tightly interconnected at angles which are free to some extent.

As shown in FIG. 1, the gas exhaust port 20 is connected to an exhaust unit 76 through a high temperature resistant seal member. Specifically a flexible tube 80 of, e.g., Hastelloy is connected to the gas exhaust port 20 through a metal gasket 78A. The tube 80 is connected to a quartz pipe 82 through an identical metal gasket 78B. The quartz pipe 82 is connected to a Teflon pipe 84.

Figure 3:
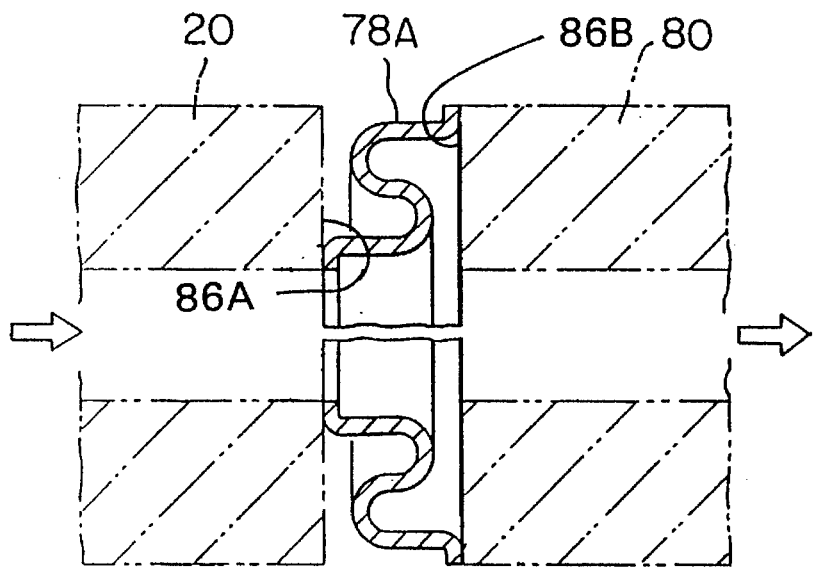
FIG. 3 is an enlarged vertical view of the portion (a seal structure of the gas exhaust port) of the heat treatment apparatus of FIG. 1 indicated by the arrow B.

A sectional view of the metal gaskets 78A, 78B is enlarged in FIG. 3, and the metal gaskets 78A, 78B are formed of rings of S-shaped sectional metal, e.g., Hastelloy. The sealing surfaces 86A, 86B on both ends of the ring are press-contacted between the gas exhaust port 18 and the tube 80 and between the tube 80 and the quartz pipe 82, whereby high sealing ability can be ensured with low fastening force, and high temperatures, e.g., 400° C. can be resisted.

Fluoro rubber O-rings of high sealing ability in place of the metal gaskets 78A, 78B cannot resist high temperatures (about 400° C.).

As shown in FIG. 1, the Teflon pipe 84 is divided in two branches one of which belongs to an evacuation exhaust unit 84A for a low pressure heat treatment, and the other of which belongs to a normal pressure exhaust unit 84B for normal pressure heat treatment. A vacuum-side opening/closing valve 88, a vacuum pump 90 for replacing gas, and harmful substance removing means 92 are inserted in the vacuum exhaust unit 84A. A normal pressure-side opening/closing valve 94, an exhaust pressure controller 96, and a scrubber 97 are inserted in the normal pressure exhaust unit 84B.

Then, the operation of the heat treatment apparatus of the above-described structure will be explained.

First a case that normal pressure high temperature processing is conducted on semiconductor wafers W will be explained.

Here a processing temperature is assumed to be 1000° C. The processing vessel 8 is heated up to a temperature lower than the processing temperature, e.g., about 600° C. by the heater 10 of the heat treatment apparatus of FIG. 1. Wafers W are loaded on the wafer boat 12 into the processing vessel.

That is, the lift means 22 is driven to lift the wafer boat 12 mounting a number of wafers W into the processing vessel 8 and load the wafers W therein, and the bottom opening of the manifold 34 is closed by the cap 26. At this time, the seal portion is secured by the high temperature resistant seal means 44 with the O-ring 48, and good air-tightness is ensured.

Then, an inert gas, e.g., nitrogen gas is fed through the gas feed port 18 to replace the air taken in the processing vessel when the wafers W are loaded with the inert gas.

When the gas replacement is thus over, then power of the heater 10 is increased to raise 600° C. of the processing vessel 8 to, e.g., 1000° C., and processing gas is fed through the gas feed unit 60. And the usual normal pressure high temperature processing is conducted. At this time, in the exhaust unit 76, the vacuum side opening/closing valve 88 of the evacuation unit 84A is closed to shut the evacuation unit 84A while the normal pressure side opening/closing valve 94 is opened, and the exhaust pressure controller 96 is driven to maintain the interior of the processing vessel 8 at a normal pressure, i.e., the atmospheric pressure. For example, the processing gas introduced into the processing vessel 8 through the gas feed port 18 ascends in a wafer region in contact with the wafers W, and when the processing gas arrives at the ceiling 6B of the processing vessel 8, the processing gas flows down in a gap between the inner tube 4 and the outer tube 6 to be discharged through the gas exhaust port 20.

During this processing, the cap 26, the gas exhaust port 20, etc. are heated to considerably high temperatures, but the O-ring 48 of the cap 26 is cooled by passing cooling water through the second cooling water passage 56 and the first cooling water passage 52. Consequently the O-ring 48 is free from damage due to its melting by the high temperature and can maintain its sealing function. The sealing is not impaired in the following low-pressure heat treatment.

Thus the normal pressure high temperature processing is conducted on the wafers W.

The inner and the outer tubes 4, 6, and the manifold 34 are connected integral by quartz, and the protection layer 42 of quartz is formed on the surface of the stainless steel cap 26. Accordingly they are free from corrosion and tarnish by corrosive gases, e.g., HCl in the processing. The normal pressure high temperature processing can be stably conducted.

Then a case that low pressure heat treatment is conducted on wafers will be explained.

When heat treatment is conducted in a vacuum low pressure atmosphere of, e.g., $10^{-0.1}$ Torr at an about 800° C., as in the normal pressure high temperature processing, the processing vessel 8 is pre-heated up to, e.g., about 600° C., and wafers W mounted on the wafer boat 12 are loaded into the processing vessel 8, and the bottom opening of the manifold 34 is tightly closed by the cap 26.

Then the normal pressure-side opening/closing valve 94 is closed, and the normal pressure exhaust unit 84B is shut off. At the same time, the vacuum-side opening/closing valve 88 is opened, and the vacuum pump 90 is driven to evacuate the interior of the processing vessel 8 through the evacuation unit 84A and maintain the interior of the processing vessel at a required reduced pressure of, e.g., about 1 Torr while processing gas is fed into the processing vessel 8 through the gas feed port 18, and the low pressure heat treatment is conducted on the wafers. In this case, as described above, the O-ring 48 of the cap 26 is cooled by cooling water passed through the first and the second cooling wafer passages 52, 56, and its sealing ability is ensured, and the sealing is never impaired.

The metal gaskets 78A, 78B between the gas exhaust port 20 and the exhaust unit 76 are also exposed to the high temperature which is lower than that of the normal pressure high temperature processing, but the gaskets 76A, 76B can retain sufficiently high sealing ability and can maintain the interior of the processing vessel 8 in the reduced pressure atmosphere.

The evacuation of the interior of the processing vessel 8 also places the gas feed unit 60 at the reduced state. But the ball joint 58, as in FIG. 4, of high sealing ability is disposed on the gas feed port 18. High sealing ability can be retained also at this seal. Thus the heat treatment apparatus as a whole can stably conduct the low pressure heat treatment on the wafers.

In the conventional heat treatment apparatus, an O-ring is provided at the joint between the stainless steel manifold and the outer tube, and a cooling mechanism for the O-ring is also provided. Accordingly this portion has lower temperatures, which sometimes cause depositions which adversely result in particles. But in the first embodiment, both the outer tube 6 and the manifold 34 are formed of quartz and communicated with each other in one-piece. Consequently it is not necessary to cool this portion, and accordingly no deposition which is a cause of particles is formed, which contributes to higher throughputs.

Thus in the first embodiment, both normal pressure high temperature processing and low pressure heat treatment can be conducted on objects to be processed in one and the same heat treatment apparatus without transferring the objects for the respective heat treatments. In a case that the above-described two heat treatments are continuously carried out on wafers W, it is not necessary to transfer the wafer to a different heat treatment apparatus. Accordingly a time for the transfer can be saved, and much improved throughputs can be achieved. In this case, the use of the so-called high speed heat treatment in which the heater 10 has higher power, and the processing vessel 8, etc. have reduced calories, whereby an increased temperature increase rate of, e.g., 100° C./min is obtained can result in further improved throughputs.

Furthermore, in conducting the above-described two heat treatments, conventionally two kinds of heat treatment apparatuses have been required. But according to the first embodiment, two kinds of heat treatments can be sequentially conducted by one and the same apparatus. Drastic cost reduction can be achieved.

In the case that thermocouples 37 are accommodated in the thermocouple tube 35, the thermocouples 37 are simply inserted into the thermocouple tube 35 through the bottom opening, and the thermocouples can be easily inserted and removed.

Figure 5:
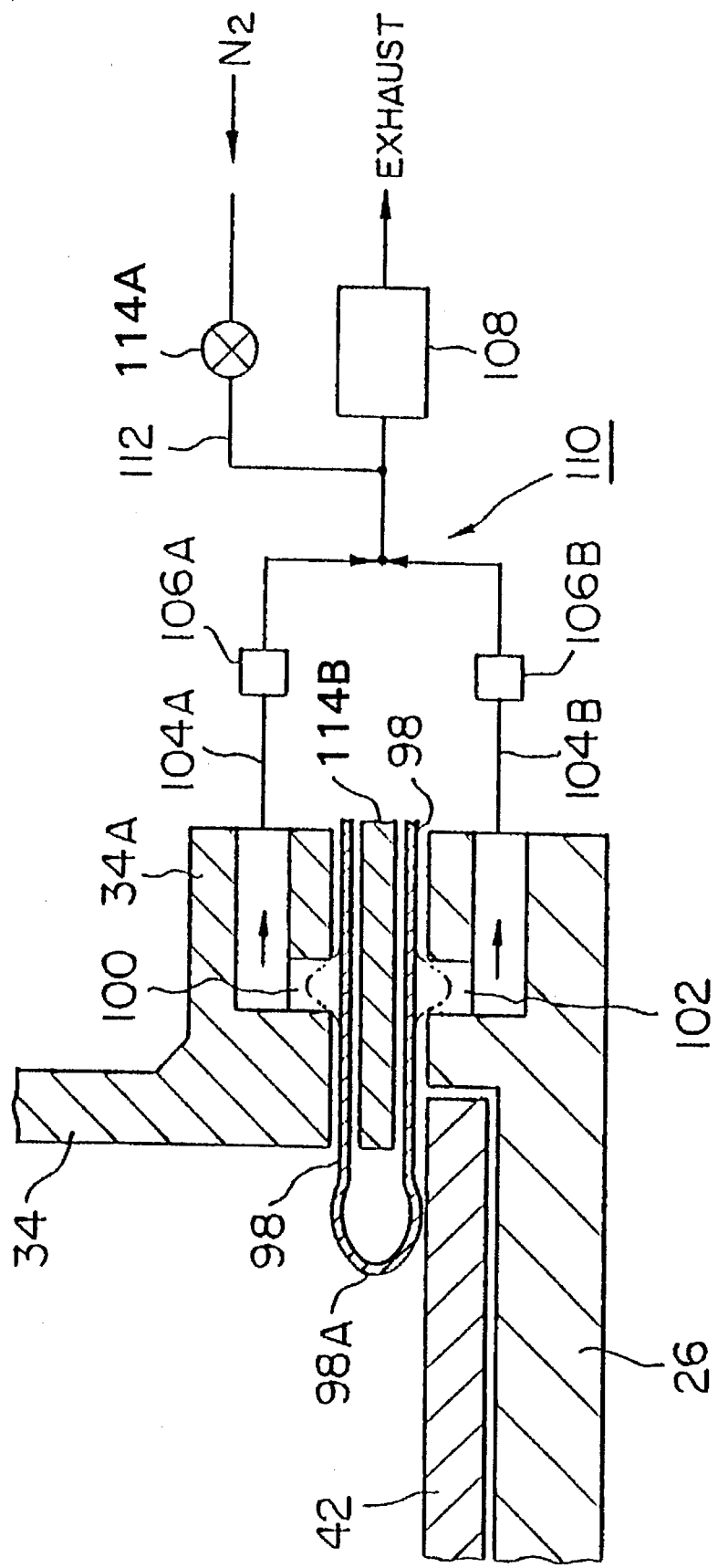
FIG. 5 is an enlarged vertical sectional view of a seal structure of the cap of FIG. 2.

In the first embodiment, the high temperature resistant seal means 44 of the cap 26 comprises the O-ring 48 and the cooling water passages 52, 56 for cooling the O-ring 48. But the means 44 is not limited to this, and may comprise a thin plate seal member 98 of a metal sheet exemplified in FIG. 5.

That is, in this case, an annular groove 100 of, e.g., a 4 mm width and an about 5 mm depth is formed in the underside of the lower flange 34A of the manifold 34, and an annular groove 102 also of a 4 mm width and an about 5 mm depth is formed in the top surface of the peripheral portion of the cap 26 at a position opposed to the annular groove 100.

Exhaust pipes 104A, 104B are respectively provided in the annular grooves 100, 102. The exhaust pipes 104A, 104B are connected commonly to a vacuum pump 108 through interconnection means 106A, 106B. Thus an exhaust mechanism 110 is constituted, so that the annular grooves 100, 102 can be evacuated.

A release pipe 112 for releasing air is branched between the vacuum pump 108, and the interconnection means 106A, 106B. The release pipe 112 is connected to an $N_2$ gas source not shown through a valve 114A in the form of; e.g., a solenoid opening/closing valve. Between the flow flange 34A of the manifold and the peripheral portion of the cap 26 there are provided two removable annular thin plate seal members 98 which can cover the open portions of the respective annular grooves 100, 102. The inner circumferential ends of the respective members 98 are bent in a ring shape and welded along all the circumference by welds 98A. These two seal members 98, 98 are formed of a 0.15 mm thickness stainless steel coated with, e.g., tantalum amorphous. The contact surfaces of the seal members 98, 98 with the lower flange 34A, and the contact surfaces thereof with the cap 26 are finished in speculum for good sealing. A cushion member 114B of, e.g., ring-shaped graphite is disposed between the two seal members 98, 98.

In this high temperature resistant seal means, when evacuation is conducted by the vacuum pump 108, atmosphere in both annular grooves 100, 102 is evacuated, and the thin plate seal members 98, 98 disposed in the open portions thereof are respectively sucked and bent in a convexity to the sucking side as indicated by the phantom line to seal the open portions of the annular grooves 98, 98. The contact surfaces of the seal members 98, 98 finished in speculum can ensure the sealing by the contact surfaces. Their sealing ability is not deteriorated by high temperatures. In this case, by finishing the lower flange 34A and the contact surface of the cap 26 in speculum, their sealing ability can be further improved. The metal sheet seal members are used as the seal members release no gas, and contamination risk is further lowered.

In the above-described first embodiment, the processing gas ascends in the inner tube and descends between the inner tube 4 and the outer tube 6. But oppositely the processing gas may ascend between the inner and the outer tubes 4, 6 and descend in the inner tube 4. In this case, the gas feed port 18 and the gas exhaust port 20 are provided at corresponding positions. It is preferred that various ports are provided to permit selection of arbitrary gas flow directions.

The processing vessel 8 has the double tube structure of the inner and the outer tubes 4, 6, but may have a single tube structure.

[Second Embodiment]

The heat treatment apparatus according to a second embodiment will be explained with reference to the drawings attached hereto.

Figure 6:
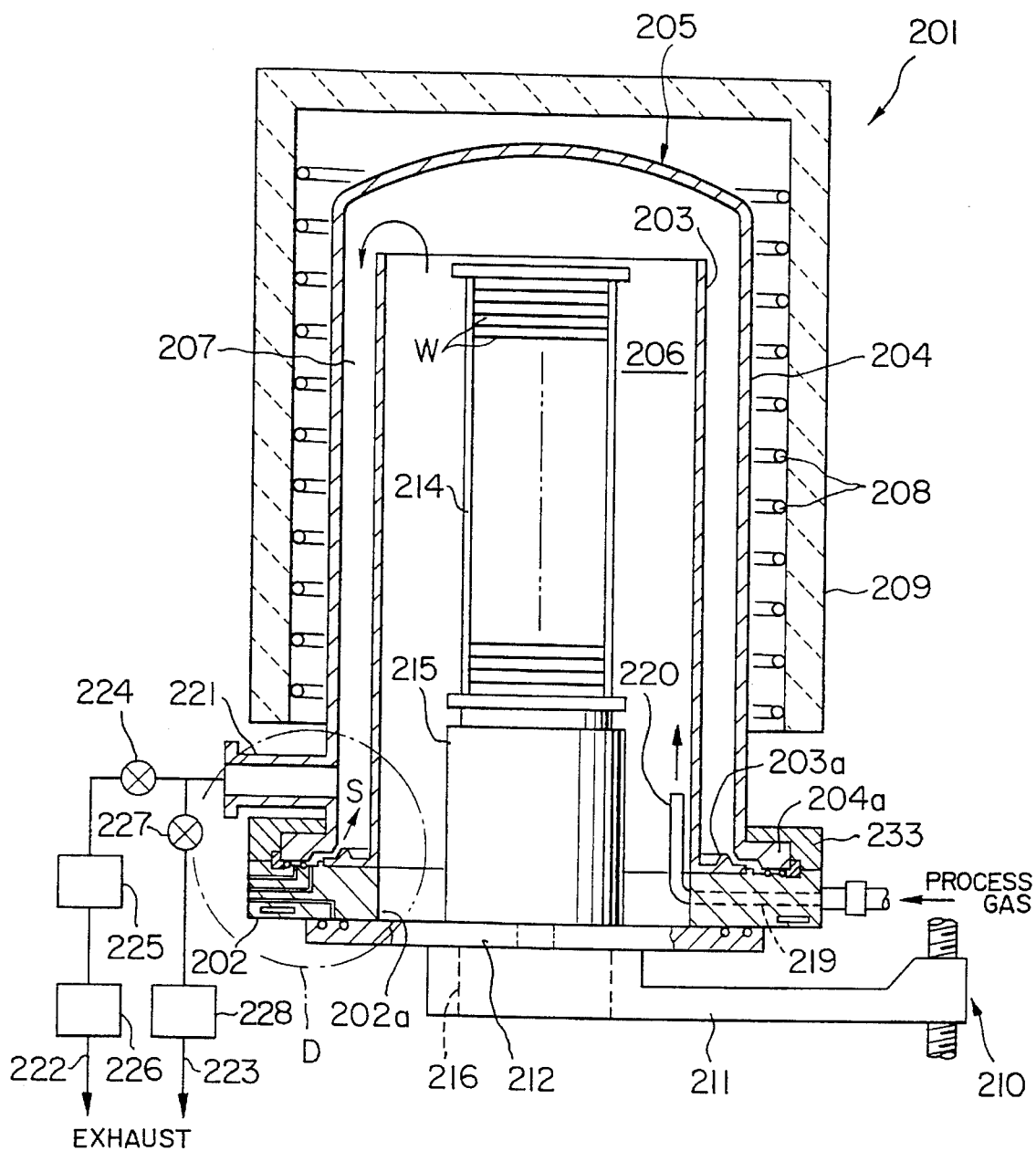
FIG. 6 is a block diagram of the heat treatment apparatus according to a second embodiment of the present invention.

FIG. 6 is a vertical sectional view of the heat treatment apparatus according to a second embodiment of the present invention. The heat treatment apparatus 201 according to the second embodiment comprises a flat ring-shaped manifold 202 of, e.g., stainless steel disposed on a base plate not shown. On the top surface of the manifold 202 there are conically provided an inner tube 203 and an outer tube 204 both of quartz, which are heat resistant and corrosion resistant. The inner tube 203 and the outer tube 204 constitute a vertical reaction tube 205 of the double structure. The inner tube 203 of the reaction tube 205 defines a processing space 206 and has a substantially equal diameter to that of an opening 202a of the manifold 202.

The outer tube 204 of the reaction tube 205 has an inner diameter which defines an annular exhaust passage 207 between the inner tube 203 and the same. Around the outside of the outer tube 204 there is provided a heating unit 209 in the form of a resistance heating line 208 wound on the outer tube 204. The heating unit 209 has the resistance heating line 208 formed of, e.g., molybdenum disilicate ($MoSi_2$), whereby a temperature of the interior of the reaction tube 205 can be increased at a high rate of 100° C./min and can be decreased at a rate of 50° C./min by forced air cooling means not shown.

Figure 7:
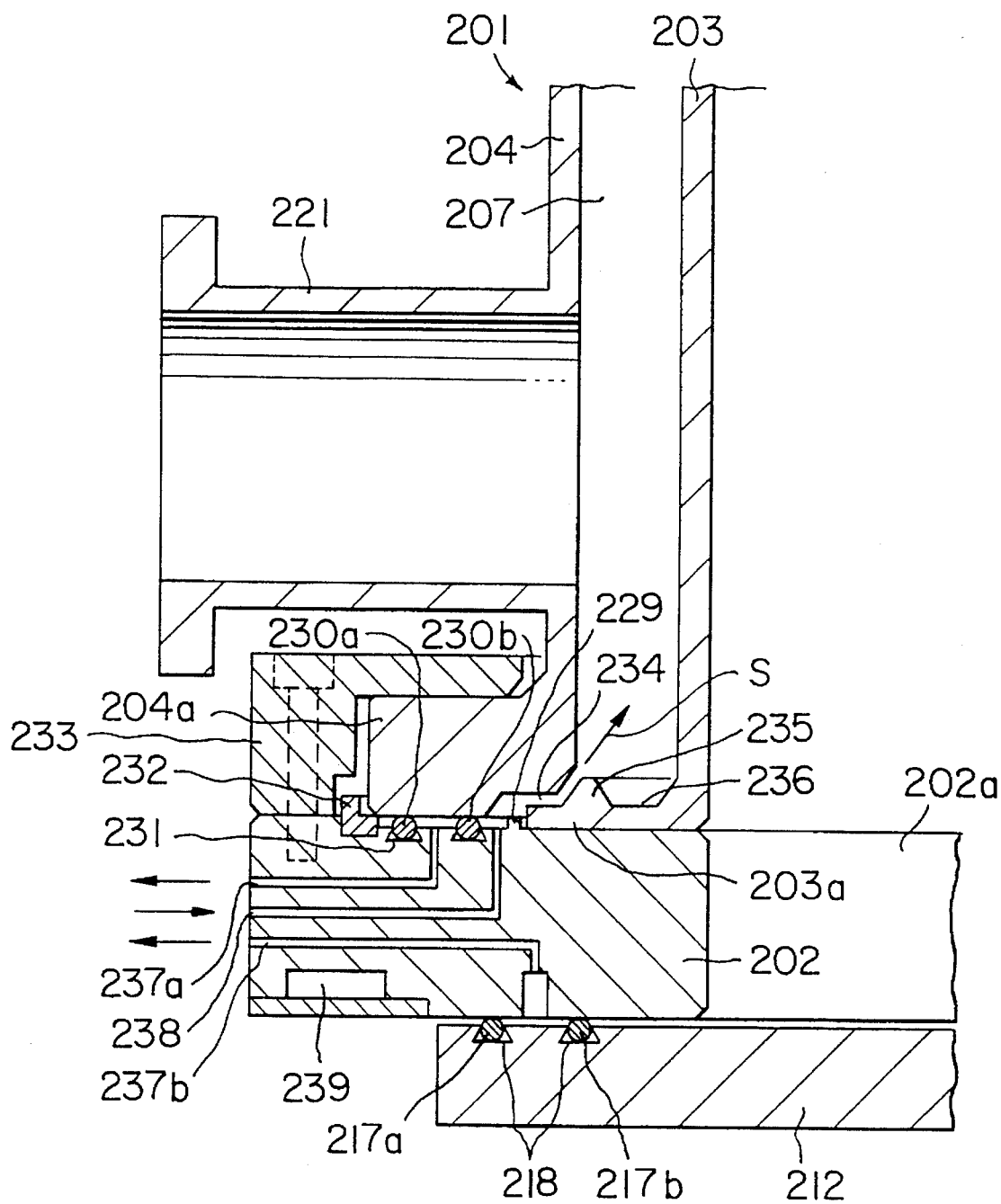
FIG. 7 is an enlarged vertical sectional view of the portion (the manifold) of the heat treatment apparatus of FIG. 6 indicated by the arrow D.

A stainless steel cap 212 mounted on a lift arm 211 of a lift mechanism 210 is openably provided on the underside of the manifold 202. A wafer boat 214 is mounted on the cap 212 through a heat insulating cylinder 215. The wafer boat 214 holds objects to be processed, semiconductor wafers W horizontal at a set vertical pitch. A rotation mechanism 216 is provided on the cap 212 for rotating the heat insulating cylinder 215. As shown in FIG. 7, on the upper peripheral edge of the cap 212 there are provided heat resistant corrosion resistant O-rings 217a, 217b of, e.g., fluoro rubber concentrically in double rings with dovetail grooves 218 formed in the cap 212. The O-rings 217a, 217b provide a seal with respect to the underside of the manifold 202.

In the manifold 202 there are circumferentially provided a plurality of processing gas feed passages 219 which are radially passed therethrough. Nozzles 220 are connected to the forward ends of the processing gas feed passages 219. The nozzles 220 rise at the peripheral edge 202a of the opening of the manifold 202 and are extended in the inner tube 203 of the reaction tube 205 upward from below for injecting a processing gas into the inner tube 203 upward from below. The proximal ends of the processing gas feed passages 219 are connected to a processing gas source not shown. In a side of the lower part of the outer tube 204 of the reaction tube 205 there is provided an exhaust pipe unit 221 for flowing exhaust gas after processing which has arrived at the lower end of the outer tube 204 down the exhaust passage 207 between the inner and the outer tubes 203, 204. The exhaust pipe 221 is connected to a low pressure processing exhaust unit 222 and a normal pressure processing exhaust unit 223. A valve 224, a vacuum pump 225, and harmful substance removing means 226 are sequentially inserted in the low pressure exhaust unit 222. A valve 227 and processing means 228 for corrosive components (e.g., HCl) in the exhaust gas, etc. are sequentially inserted in the normal pressure processing exhaust unit 223.

The lower ends of the inner tube 203 and of the outer tube 204 are separated from each other, and outward flanges 203a, 204a which are mounted on the top surface of the manifold 202 are formed respectively on the lower ends of the inner and the outer tubes 203, 204.

Figure 8:
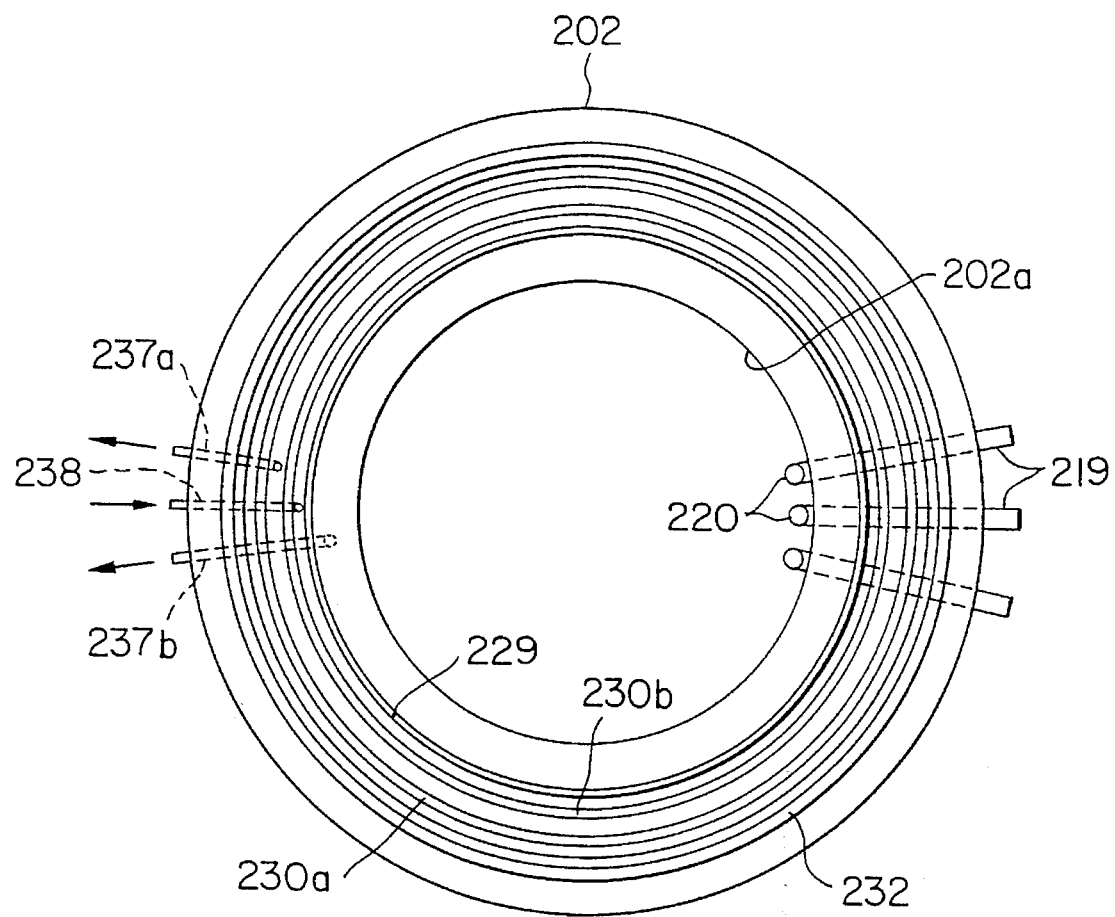
FIG. 8 is a plan view of the manifold of FIG. 7.

As shown in FIGS. 7 and 8, a positioning projection 229 for surrounding the outer circumference of the flange 203a of the inner tube 203 directly mounted on the top surface of the manifold 202 is formed on the top surface of the manifold 202. O-rings 230a, 230b of, e.g., fluoro rubber for seal with respect to the flange 204a of the outer tube 204 are disposed concentrically in double rings in dovetail grooves 231.

An L-shaped sectional positioning ring 232 of Teflon for surrounding the outer circumference of the flange 204a of the outer tube 204 to restrict horizontal displacement of the outer tube 204 and define an installation height and position is disposed around the outside of the O-rings 230a, 230b on the top surface of the manifold 202. A presser member 233 for securing the flange 204a of the outer tube 204 is fastened with bolts to the manifold 202, outside of the positioning ring 232.

The forward end portion of the flange 203a of the inner tube 203 is a little overlapped beneath a proximal portion of the flange 204a of the outer tube 204, and a set gap 234 for injecting a seal gas S is provided between the upper surface of the forward end portion of the flange 203a of the inner tube 203 and the underside of the base portion of the flange 204a of the outer tube 204, which is opposed to the upper surface of the forward end portion. The seal gas S is preferably an inert gas, such as nitrogen ($N_2$)gas, argon (Ar) gas, helium (He) gas or others, and especially nitrogen ($N_2$) gas is more preferable. It is preferable that the seal gas S is injected at an about 2 l/min rate through the gap 234, and a width of the gap 234 is, e.g., about 0.5 mm. An annular projection 235 is formed on the upper surface of the flange 203a of the inner tube 203 for maintaining an enough distance of the gap 234 and an annular concavity 236 is formed inside the projection 235.

The manifold 202 has pressure decreasing passages 237a, 237b for decreasing a pressure between the double O-rings 217a, 217b formed in the top surface of the cap 212 with the dovetail groove 218 therebetween. For decreasing the pressure between the double O-rings 230a, 230b formed in the top surface of the manifold 202, a passage 238 is provided for feeding the seal gas S into the gap 234. The pressure reducing passages 237a, 237b are connected to a low pressure source not shown, such as a vacuum pump, etc. The manifold 202 has a cooling water passage 239 for cooling the O-rings 217a, 217b, 230a, 230b, etc.

Next, the operation of the second embodiment will be explained. When a dry oxidation, for example, is conducted at the normal pressure, using oxygen ($O_2$) and hydrogen chloride (HCl) as processing gases, first as shown in FIG. 6, the wafer boat 214 holding wafers W horizontal on multi-stages is loaded by the lift mechanism 210 into the reaction tube 205 whose interior has been preheated up to a required temperature (e.g. 850° C.), and opening of 202a of the manifold 202 is closed by the cap 212. In the ordinary pressure processing, pressure reduction is necessary between the O-rings 217a, 217b of the cap 212. Pressure reduction between the O-rings 230a, 230b of the manifold 202 is not necessary.

Then, the normal pressure processing exhaust unit 223 is operated while a seal gas S is injected from the gap 234 between the inner and the outer tubes 203, 204 of the reaction tube 205. In this state the processing gases are fed into the reaction tube 205 from the nozzles 220, and the heat treatment is started. While the processing gases are ascending in the inner tube 203 of the reaction tube 205, the heat treatment is conducted on the wafers. Exhaust gases descend in the exhaust passage 207 between the inner tube 203 and the outer tube 204 and are discharged into the normal pressure processing exhaust unit 223 from the exhaust gas pipe unit 221 in the lower portion of the outer tube 204.

The exhaust gas which contains hydrogen chloride (HCl) is very corrosive, but the corrosive exhaust gas is hindered from contacting the manifold 202 by the seal gas S which flows through the gap 234 and between the lower ends of the inner and the outer tubes 203, 204 of the reaction tube 205. Thus corrosion of the manifold 202 by the corrosive exhaust gas can be prevented. Durability of the manifold can be secured. Part of the corrosive product which has not been discharged through the exhaust gas pipe unit 221 stays in the concavity 236 on the flange 203a of the inner tube 203, but the flange 203a of the inner tube 203 is formed of a corrosion resistant material, e.g., quartz and is not corroded.

In the heat treatment apparatus according to the second embodiment, the gap 234 for a seal gas S is formed between the upper surface of the forward end portion of the flange 203a of the inner tube 203, and opposed underside of the base portion of the flange 204a of the outer tube, which can be mechanically polished with high precision, and a width of the gap 234 is not easily varied due to thermal deformation, etc. Maintenance of the gap 234 is easy. In the reaction tube 205, the lower ends of the inner tube 203 and the outer tube 204 are separated from each other, and this facilitates their fabrication, washing and handling. The manifold 202 has a flat ring shape, which can make the structure simple and small-sized.

In this heat treatment apparatus, the double O-rings 217a, 217b: 230a, 230b are used respectively between the manifold 202 and the cap 212 and between the manifold 202 and outer tube 204 of the reaction tube 205. In addition, pressure reduction is conducted between the O-rings 217a, 217b and between the O-rings 230a, 230b, whereby high sealing ability can be available. For example, after high pressure reduction down to below 1×10⁻⁶ Torr, CVD processing is possible at a required pressure of, e.g. 1 Torr. To conduct the CVD processing, the low pressure exhaust unit 222 is operated, and the normal pressure processing exhaust unit 223 is operated as described above for oxidation, diffusion, etc under the normal pressure.

Thus according to the second embodiment, various heat treatments can be conducted by one and the same heat treatment apparatus 201 without transferring objects to be processed, which results in lower equipment costs. The above-described various heat treatments can be continuously conducted in the same reaction tube 205 without transferring objects to be processed, which results in higher throughputs. In this case, the use of the heating unit 209 which increases and decreases the temperatures at high rates further raises throughputs.

Figure 9:
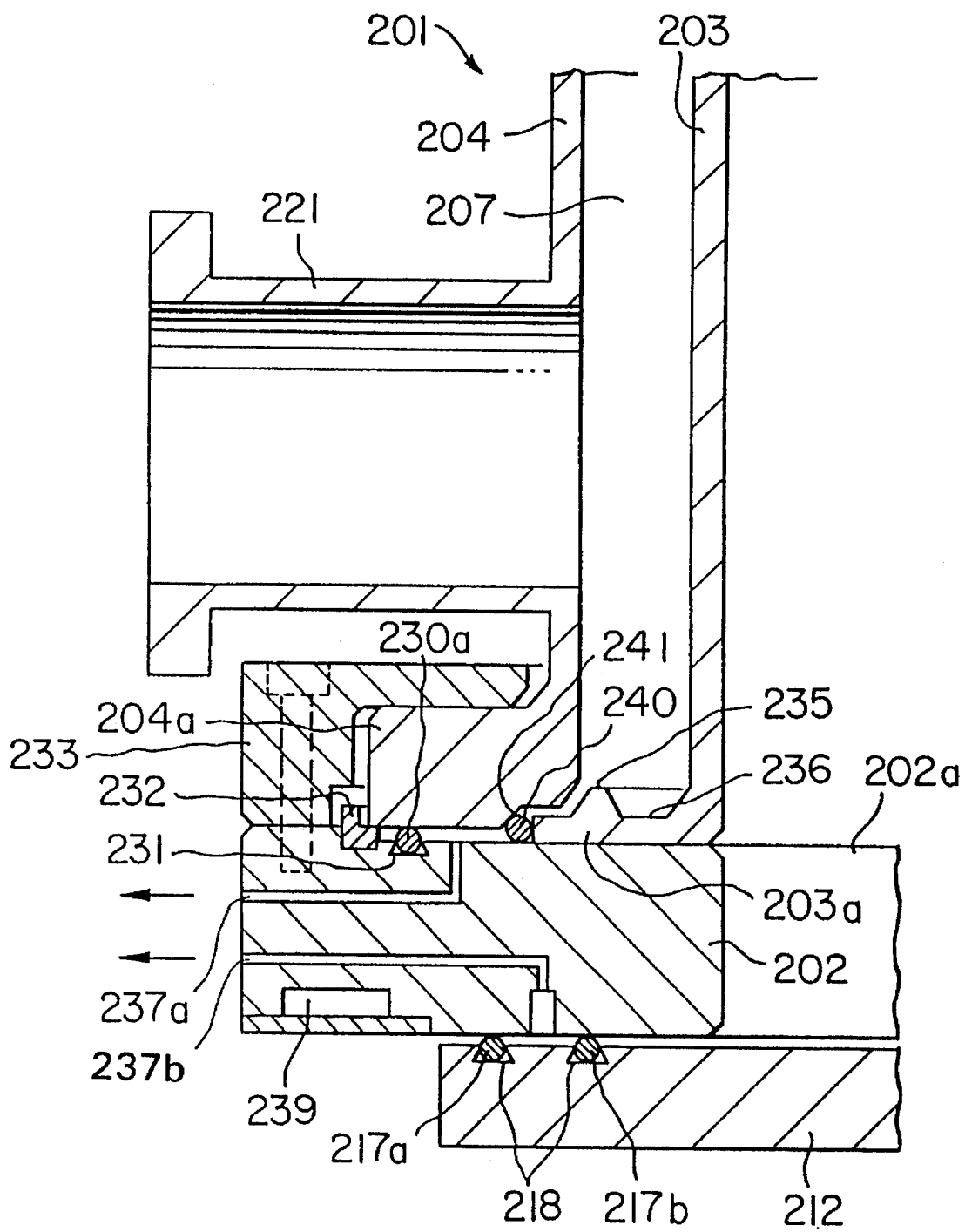
FIG. 9 is a vertical sectional view of a variation of the manifold of FIG. 7.

FIG. 9 is an enlarged vertical sectional view of a major part of a variation of the heat treatment apparatus according to the second embodiment of the present invention. Common members of the variation with the second embodiment have common reference numerals. In this variation of the heat treatment apparatus, in place of injecting a seal gas between the lower end portions of an inner and an outer tubes 203, 204 of a reaction tube 205, an O-ring 240 is provided between the lower ends of the inner tube 203 and the outer tube 204.

Differently from the heat treatment apparatus 201 according to the second embodiment, this variation does not include on a manifold 202 the positioning projection 229 for the inner tube 203, or the inner O-ring 230b. This variation includes an O-ring 240 of, e.g., fluoro rubber at the position of the positioning projection 229. That is, the O-ring 240 is provided between the forward end of a flange 203a of the inner tube 203, and a slant cut 241 of the underside of the base of a flange 204a of the outer tube 204, which is opposed to the forward end of the flange 203a.

The heat treatment apparatus according to this variation can provide substantially the same functional effects as that according to the second embodiment. Due to the O-ring 240 seal between the lower ends of the inner and the outer tubes 203, 204 of the reaction tube 205 in contact with the manifold 202, the structure of the heat treatment apparatus is simpler than that of the heat treatment apparatus according to the second embodiment, and can prevent corrosion of the manifold 202 at lower costs.

The present invention is not limited to the above-described embodiments and can cover variations within the scope of the present invention. For example, in the heat treatment apparatus, in which processing gases are fed upward from below, corrosion due to corrosive processing gases does not take place easily on the exposed surfaces of the manifold 202 and the cap 212, but to make it sure, a heat resistant corrosion resistant protection layer of, e.g., quartz may be formed on the exposed surfaces. Materials of the reaction tube 205 are exemplified by, in addition to quartz, sapphire, alumina, etc. Objects to be processed may be LCDs in addition to semiconductor wafers.

[Third Embodiment]

The heat treatment apparatus according to a third embodiment of the present invention will be explained with reference to the drawings attached hereto.

Figure 10:
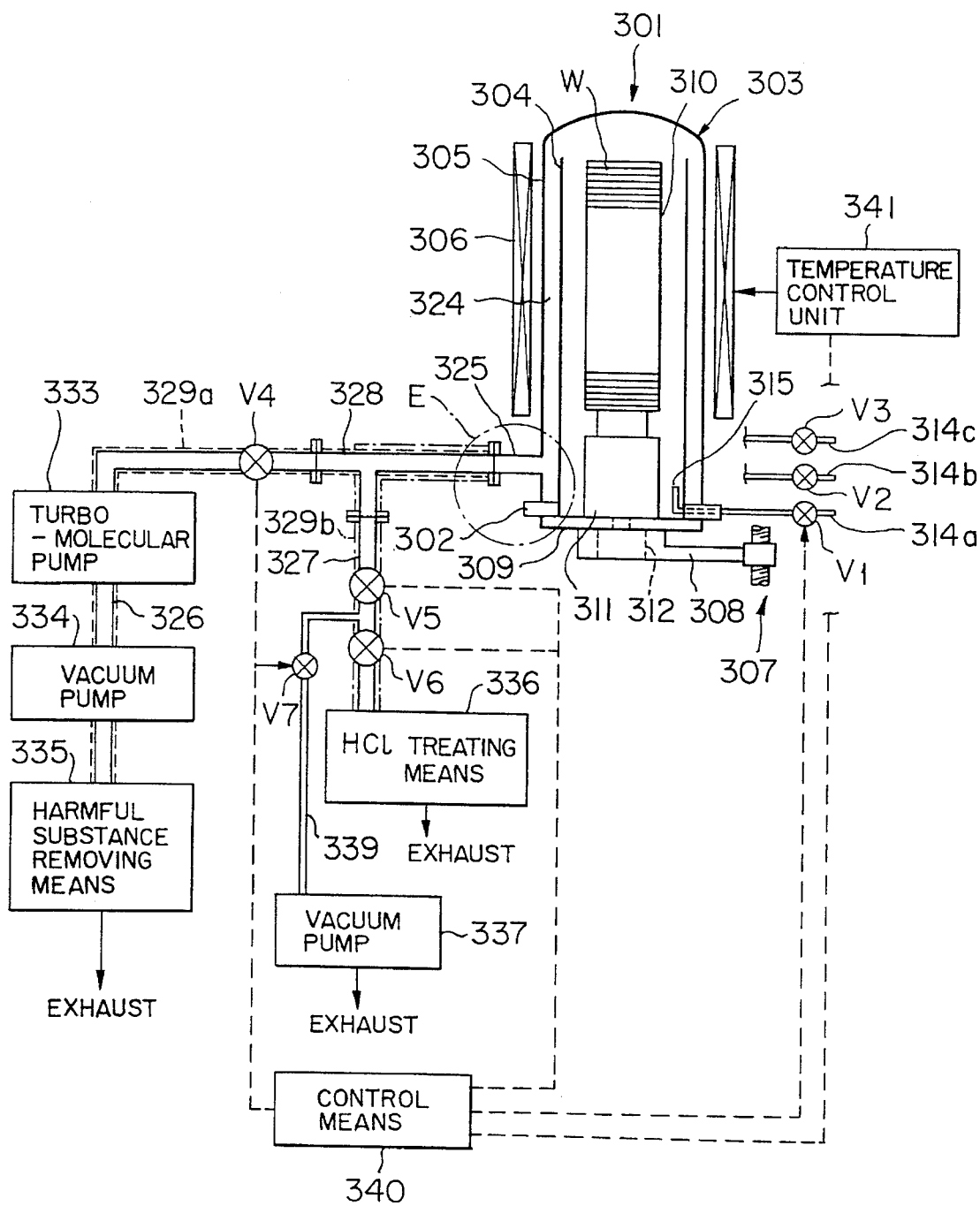
FIG. 10 is a block diagram of the heat treatment apparatus according to a third embodiment of the present invention.

As shown in FIG. 10, the heat treatment apparatus 301 according to the third embodiment includes a flat ring-shaped manifold 302 of, e.g., stainless steel mounted on a base plate not shown. On the top surface of the manifold 302 there is provided a vertical reaction tube 303 of a heat resistant corrosion resistant material, e.g., quartz as a processing chamber for processing objects to be processed, e.g., semiconductor wafers W. The reaction tube 303 has a double structure of an inner tube 304 and an outer tube 305 with a ceiling. A heating unit 306 in the form of wound resistant heating lines is provided around the outside of the reaction tube 303. The resistant lines of the heating unit 306 are formed of e.g., molybdenum disilicate (MoSi2), so that a temperature of the interior of the reaction tube 303 is raised quickly at, e.g., about 100° C./min and can be lowered by a forced air cooling mechanism not shown at, e.g., about 50° C.

A cap 309 of stainless steel mounted on a lift arm 308 of a list mechanism 307 is openably provided on the underside of the manifold 302. A wafer boat 310 for holding wafers W on multi-stages at a set pitch is mounted on the cap 309 through a heat insulating cylinder 311. The cap 309 has a rotation mechanism 312 for rotating the heat insulating cylinder 311.

Figure 11:
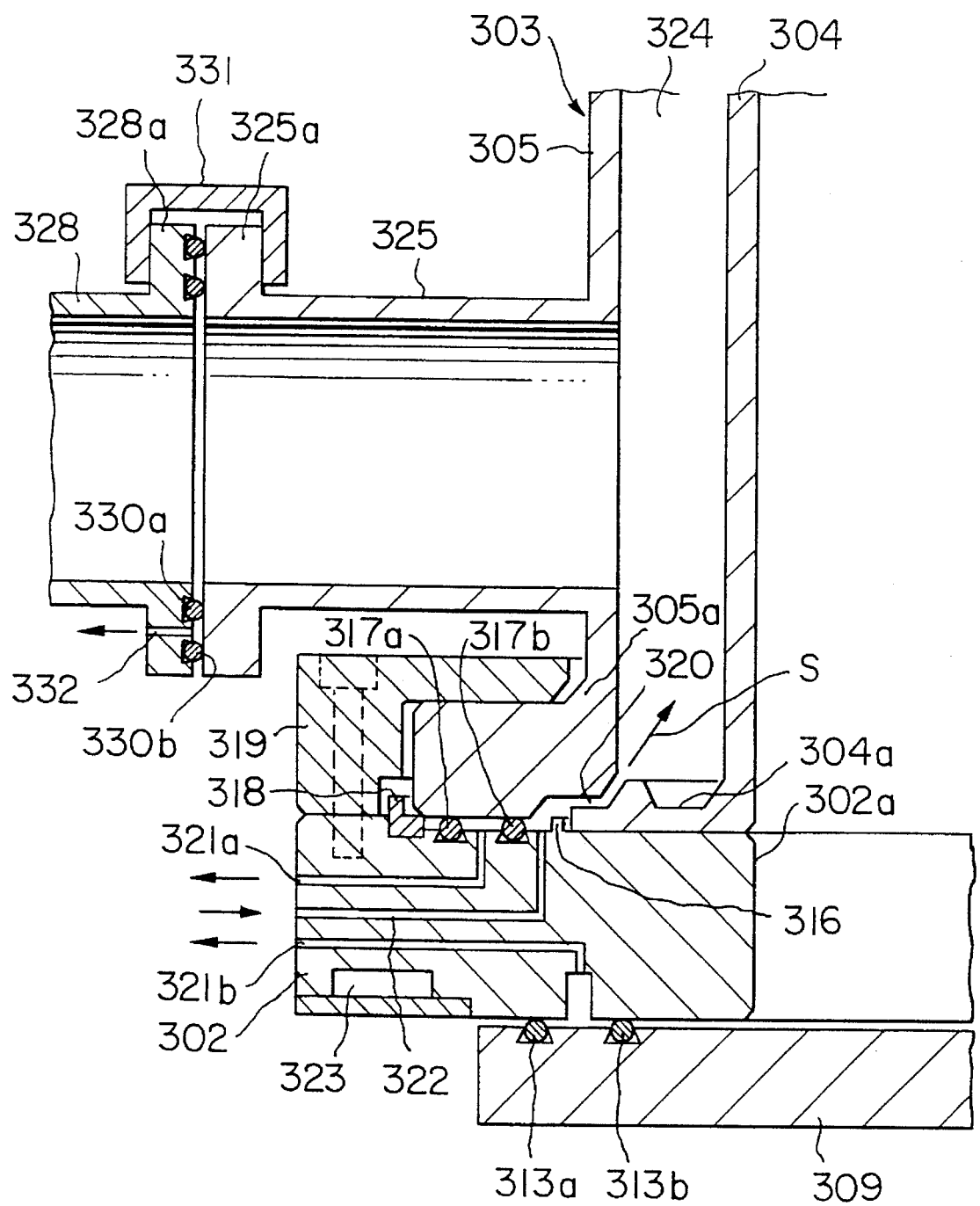
FIG. 11 is an enlarged vertical sectional view of the portion (the manifold) of the heat treatment apparatus of FIG. 10 indicated by the arrow E.
Figure 12:
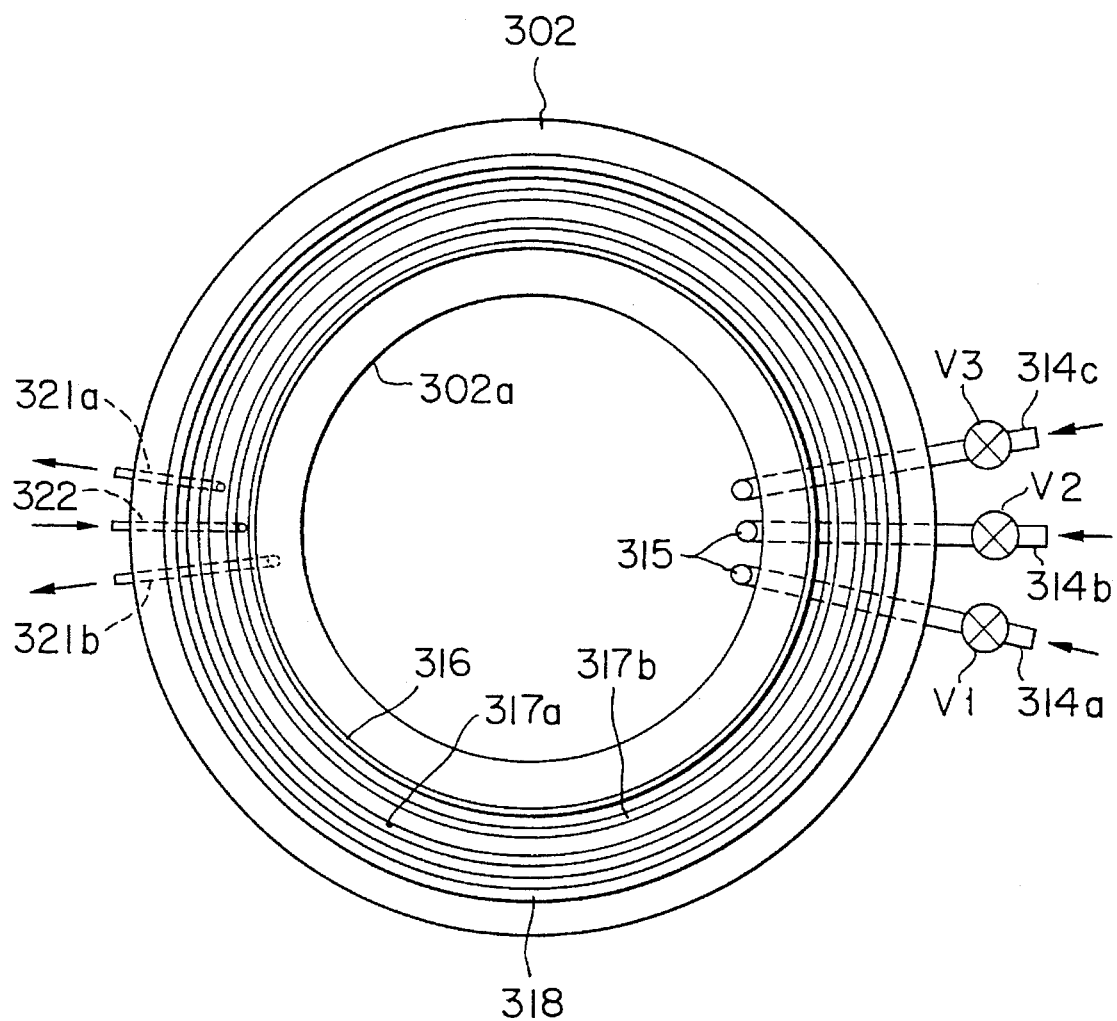
FIG. 12 is a plan view of the manifold of FIG. 11.
Figure 13:
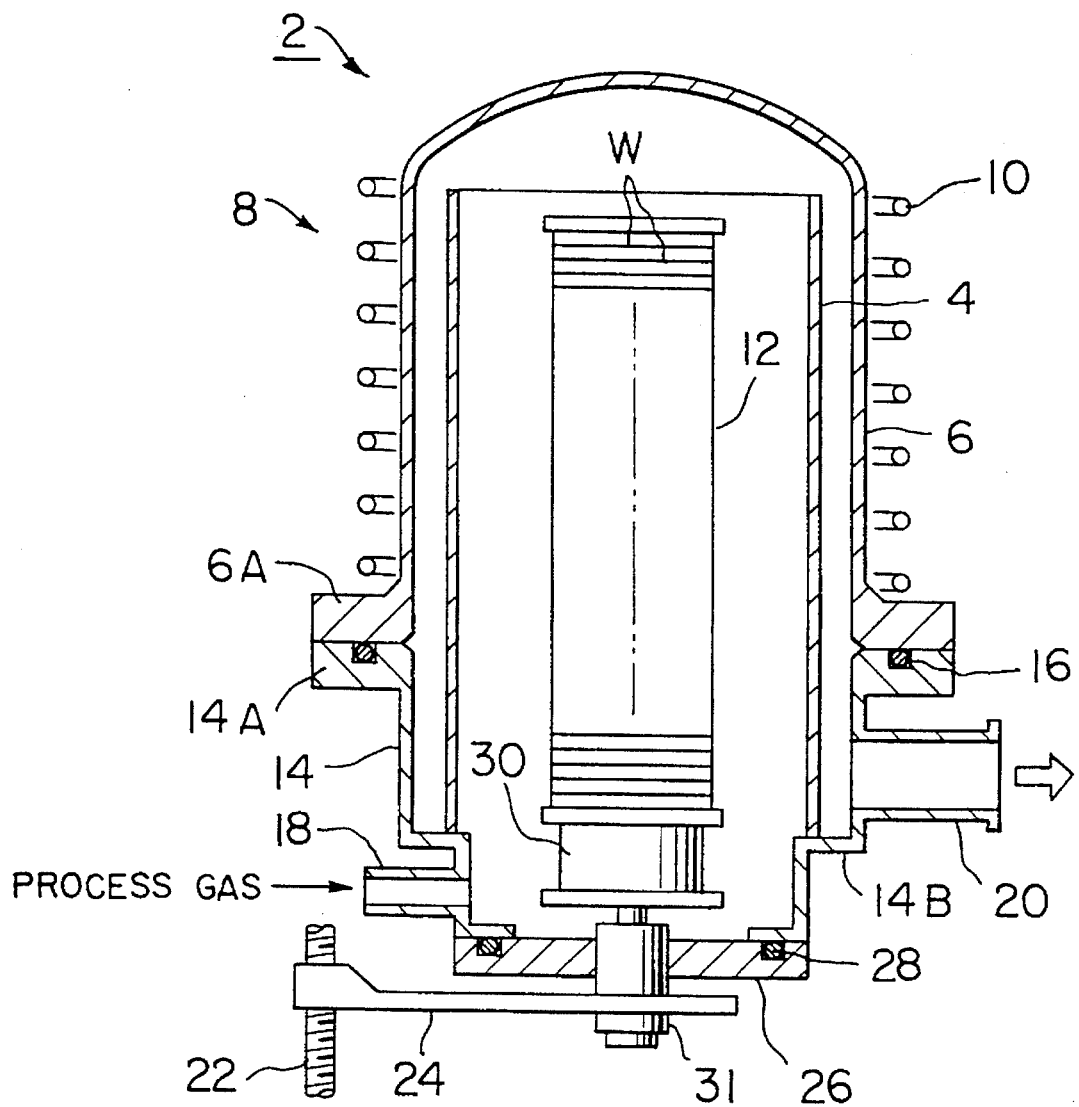
FIG. 13 is a vertical sectional view of the conventional heat treatment apparatus.

As shown in FIG. 11, O-rings 313a, 313b of a heat resistant corrosion resistant material, e.g., fluoro rubber having different diameters are provided concentrically double on the peripheral top surface of the cap 309 for sealing with respect to the underside of the manifold 302.

As shown in FIG. 10, a plurality of processing gas feed passages 314a, 314b, 314c as a processing gas feed unit are provided radially in the manifold 302. Nozzles 315 for injecting processing gas upward into the inner tube 304 from below are connected to the forward ends of the processing gas feed passages 314a, 314b, 314c are raised from the periphery of the opening 302a of the manifold 302 and extended upward in the inner tube 304. The proximal ends of the processing gas feed passages 314a, 314b, 314c are connected, through valves V1, V2, V3, to processing gas sources (not shown) for feeding a processing gas in accordance with a required processing, e.g., dichlorosilane (SiH2Cl2) and ammonium (NH3) for silicon nitride (Si3N4) film deposition, and oxygen ($O_2$) and hydrogen chloride (HCl) for dry oxidation. In this third embodiment, for explanation, the valve V1 is for feeding dichlorosilane, the valve V2 is for feeding ammonium, and the valve V3 is for feeding oxygen and hydrogen chloride.

As shown in FIG. 11, outward flanges 304a, 305a are formed respectively on the lower end of the inner tube 304 of the reaction tube 303, and on the lower end of the outer tube 305 of the reaction tube 303. On the top surface of the manifold 302 there is a positioning projection 316 for surrounding the outer circumference of the flange 304a of the inner tube 304 directly mounted on the top surface of the manifold 302, and O-rings 317a, 317b of, e.g., fluoro rubber of different diameters concentrically double. On the top surface of the manifold 302 there are provided an L-shaped sectional positioning ring 318 of, e.g., Teflon for surrounding the outer circumference of the flange 305a of the outer tube 305 to restrict horizontal displacement thereof, and setting an installation height, and a presser member 319 with bolts for securing the flange 305a of the outer tube 305.

The forward end of the flange 304a of the inner tube 304 is a little overlapped with the base of the flange 305a of the outer tube 305. A gap 320 is formed between the upper surface of the forward end of the flange 304a of the inner tube 304 and the opposed underside of the base of the flange 305a of the outer tube 305 for injecting a seal gas for preventing corrosion of the manifold 302 by corrosive exhaust gas. The seal gas is an inert gas, e.g., nitrogen gas ($N_2$) gas, As shown in FIG. 11, in the manifold 302 there are formed evacuation passages 321a, 321b for evacuating the space between the double O-rings 317a, 317b on the top surface of the manifold 302 and the space between the double O-rings 313a, 313b on the cap 309 by, e.g., a vacuum pump 337 or others which will be explained later (see FIG. 10). The manifold 302 also has a seal gas feed passage 322 for feeding a seal gas S to the gap 320. Further in the manifold 302 there is provided a cooling water passage 323 for cooling the O-rings 317a, 317b, etc.

As shown in FIG. 10, a gap 324 (exhaust gas passage) is formed between the inner and the outer tubes 304, 305 of the reaction tube 303 for flowing down exhaust gas after processing, and an exhaust gas pipe unit 325 is provided in a lower part of the outer tube 305 for discharging exhaust gas after processing. The exhaust pipe portion 325 is connected to an evacuation unit 326 and a normal pressure exhaust unit 327 through a branch pipe 328.

The branch pipe 328, and the pipes of the evacuation unit 326 and the normal pressure exhaust unit 327 are formed of a heat resistant corrosion resistant material e.g., Hastelloy. Heating bands 329a, 329b made of, e.g., resistant heating lines coated with a heat resistant resin are wound on the branch pipe 328, and the pipes of the evacuation unit 326 and the normal pressure exhaust unit 327 as heating means for the prevention of dewing and deposition of components of the exhaust gas. The heating temperature is set at above a dew-point temperature or a deposition temperature of components of the exhaust gas, e.g., 150°–200° C.

To connect the exhaust pipe portion 325 and the branch 328 which are formed of different materials, as shown in FIG. 11, O-rings 330a, 330b of fluoro rubber having different diameters are concentrically double between flange 325a, 328a of the exhaust pipe portion 325 and the branch pipe 328, and both flanges 325a, 328a are connected by a clamp member 331. To further improve air-tightness between both flanges 325a, 328a, an evacuation passage 332 is formed in the flange 328a of the branch pipe 328 for evacuation between the double O-rings 330a, 330b.

As shown in FIG. 10, in the evacuation unit 326 there are arranged sequentially a normal valve V4 of high air-tightness, a turbo-molecular pump 333, a vacuum pump 334 and harmful substance removing means 335. In the normal pressure exhaust unit 327 there are sequentially arranged a pair of valves V5, V6 in the form of ball valves of a corrosion resistant material, e.g., Teflon (registered trademark), and HCl treating means 336 for neutralizing or recovering hydrogen chloride, a corrosive component of the exhaust gas. A pipe interconnecting the valves V5, V6 is connected through an evacuation pipe 339 to a vacuum pump 337 which is means for evacuating the pipe between the valves V5, V6. A valve V7 is inserted in the evacuation pipe 339. The evacuation unit 326 and the normal pressure exhaust unit 327 are connected to an exhaust unit (not shown) of a factory.

The valves for feeding a processing gas V1, V2, V3, the valves V4, V5, V6 for exhaust gas, and the valve V7 for evacuation are solenoid valves and are controlled by control means 340 connected to these valves. That is, for example, in depositing silicon nitride films by low pressure CVD, which is a vacuum processing, the control means 340 opens the valves V1, V2, V4. V7, closing the valves V3, V5, V6. For example in a dry oxidation, which is a normal pressure processing, the valves V3, V5, V6 are opened, closing the valves V1, V2, V4, V7. Thus in the heat treatment apparatus 301 according to the third embodiment, when a processing is conducted with the evacuation unit 326 operated, a pair of valves V4, V6 of the normal pressure exhaust unit 327 are closed to evacuate between both valves V5, V6. The temperature control means 341 controls the heating unit 306 through a temperature control unit 341 to be set at, e.g., 750° C. for silicon nitride film deposition, and at, e.g., 850° C. for dry oxidation.

Next the operation of the third embodiment will be explained. When silicon nitride film deposition by low-pressure CVD, for example, is conducted, as shown in FIG. 10, first wafers W are mounted on the wafer boat 310, the lift arm 308 is raised to load the wafer boats into the reaction vessel 303, and the opening 302a of the manifold 302 is closed by the cap 309. In this processing, the control means 340 opens the valves V1, V2, V4, V7, closing the valves V3, V5, V6 and sets the heating unit 306 at 750° C. through the temperature control unit 341. Accordingly the interior of the reaction tube 303 is evacuated by the operation of the evacuation unit 326 driven by the vacuum pump 334. In this vacuum and at a required temperature dichlorosilane and ammonium are fed, whereby silicon nitride films are deposited on the wafers W.

In this processing in vacuum, a pair of valves V5, V6 of the normal pressure exhaust unit 327 are closed, and evacuation is conducted between both valves V5, V6 by the vacuum pump 337. Accordingly when a processing is conducted with the evacuation unit 326 operated, the normal pressure exhaust unit is shut off by both valves V5, V6. Even if they are less air-tight, evacuation is conducted between them so that the pressure differential across the valve V5 is small, whereby reverse flows of exhaust gas and particles from the normal pressure exhaust unit 327 back into the reaction tube 303 can be prevented. In this processing in vacuum, the branch pipe 328, the pipes of the evacuation unit 326 are heated by the heating band 329a, which can prevent deposition of components of the exhaust gas, e.g., ammonium chloride.

When this processing is followed by, e.g., a dry oxidation without transferring objects to be processed, the control means opens the valves V3, V5, V6 closing the valves V1, V2, V4, V7, while setting the heating unit 306 at 850° C. through the temperature control unit 341. Accordingly the interior of the reaction tube 303 is exhausted at the normal pressure by an exhaust unit of a factory through the normal pressure exhaust unit 327, and oxygen and hydrogen chloride are fed at the normal pressure and a required temperature through the processing gas feed passage 314c. Dry oxidation is conducted on the objects to be processed.

In the normal pressure processing, the branch pipe 328, and the pipes of the normal pressure exhaust unit 327 are heated above their dew-point temperatures by the heating band 329b, whereby components of exhaust gas are prevented from dewing. Hydrogen chloride, which is relatively inert in a dry state, becomes very corrosive with increased moisture content. The hydrogen chloride is neutralized or recovered by the treating means 336

Thus in the heat treatment apparatus 301 according to the third embodiment of the present invention, the exhaust unit includes the evacuation unit 326 and the normal pressure exhaust unit 327. A pair of valves V5, V6 are provided in the normal pressure exhaust unit 327. In processing in vacuum, both valves V5, V6 are closed while the space between them is evacuated, whereby reverse flow of exhaust gas, etc. from the normal pressure exhaust unit 327 can be prevented.

Processing in vacuum and processing at the normal pressure can be conducted by one and the same apparatus. Thus, this heat treatment apparatus 301 can reduce equipment costs, and does not require wafers W be transferred from each processing, which results in higher wafer quality and productivity. The use of the heating unit 306 which enables high speed heat treatment further improves productivity.

In this heat treatment apparatus 301, double O-rings 317a, 317b; 313a,313b; 330a, 330b are concentrically provided between the flange of the outer tube of the reaction tube 303 and the manifold 302, between the manifold 302 and the cap 309 and between the exhaust pipe portion 325 of the reaction tube 303 and the branch pipe 328 of the exhaust unit, and evacuation is conducted between the O-rings 317a, 317b between the O-rings 313a, 313b and between the O-rings 330a, 330b. The normal pressure exhaust unit 327 includes a pair of valves V5, V6, and in processing in vacuum both valves V5, V6 are closed while evacuation is conducted between the valves V5, V6. As a result, a high vacuum of, e.g., about $1\times10^{-6}$ Torr can be established in the reaction tube 303. For the normal pressure processing it not essential to evacuate between the O-rings 317a, 317b, between the O-rings 313a, 313b and between the O-rings 330a, 330b.

In the heat treatment apparatus 301, the control means 340 switches the valves V1, V2, V3 for the processing gas feed, the valves V4, V5, V6 for the exhaustion, and the valve V7 for the evacuation in accordance with a processing. The temperature of the heating unit 306 is controlled by the temperature control unit 341. As a result, operators require no skill to operate the heat treatment apparatus so as to obtain homogeneous quality. This heat treatment apparatus can store information for switching the valves V1–V7. The control means 340 stores temperatures of the heating unit 306 and processing times for various processings, and a processing menu is selected to conduct a required processing.

The present invention is not limited to the third embodiment and covers variations and modifications within the scope of the present invention. For example, in the third embodiment, one exhaust pipe portion 325 is formed in the reaction tube 303 which is a processing chamber, and the exhaust pipe portion 325 is connected, through the branch pipe 328, to the evacuation unit 326 and the normal pressure exhaust unit 327. But it is possible that the reaction tube 303 has two exhaust pipe portions, and one of the exhaust pipe portions is connected to the evacuation unit 326, and the other is connected to the normal pressure exhaust unit 327. In the third embodiment, first low pressure CVD is conducted to deposit silicon nitride films, and dry oxidation follows. But this is one example, and various processings combining diffusion, annealing, etc. can be conducted.

What is claimed is:

1. A thermal processing apparatus comprising a processing chamber including an inner tube having an opened bottom for accommodating objects to be processed on an object-to-be-processed boat, and an outer tube concentrically disposed outside the inner tube, a gas feed port connected to the processing chamber for introducing a processing gas into the processing chamber, a cylindrical manifold having an exhaust gas port for discharging gas in the processing chamber, and a cap for tightly closing the opened bottom of the manifold openably; wherein the inner tube, the outer tube, and the manifold are separately preformed pieces of quartz, said apparatus having glass-melted connections which join said pieces of quartz to provide an integral structure which includes the inner tube, the outer tube, and the manifold; an inner surface of the cap on the side of the processing chamber being coated with a protecting layer of a heat resistant and corrosion resistant material, and a high temperature heat resistant seal being provided on an abutting portion between the cap and the manifold, wherein the high temperature heat resistant seal means includes O-rings, and a cooling means for cooling the O-rings.

2. The thermal processing apparatus according to claim 1, wherein the high temperature heat resistant seal means comprise annular grooves formed respectively in the manifold and the cap, exhaust means connected to the respective annular grooves, and annular thin plate seal members disposed between the manifold and the cap.

3. A thermal processing apparatus comprising a processing gas feed unit and an exhaust unit connected to a processing chamber for processing objects to be processed, the exhaust unit including an evacuation unit and a normal pressure exhaust unit, the normal pressure exhaust unit having a pair of valves, evacuation means being inserted between the valves of the pair.

4. The thermal processing apparatus according to claim 2, wherein the evacuation unit and the normal pressure unit include heating means for preventing dewing and deposition of components of the exhaust gas.

5. A method of operating a thermal processing apparatus which includes a processing gas feed unit, an evacuation unit, and a normal pressure exhaust unit which are connected to a processing chamber for processing objects to be processed, the method comprising, when a processing is conducted with the evacuation unit operated, the step of closing a pair of valves of the normal pressure exhaust unit and evacuating between the valves of the pair.

* * * * *